United States Patent [19]

Fujimoto

[11] Patent Number: 4,966,482
[45] Date of Patent: Oct. 30, 1990

[54] SUBSTRATE SUPPORT OF INTEGRAL CONSTRUCTION

[75] Inventor: Nobuaki Fujimoto, Okazaki, Japan

[73] Assignee: Kitagawa Industries Company, Ltd., Nagoya, Japan

[21] Appl. No.: 432,304

[22] Filed: Nov. 3, 1989

Related U.S. Application Data

[63] Continuation of Ser. No. 102,500, Sep. 29, 1987, abandoned, which is a continuation of Ser. No. 815,024, Dec. 31, 1985, Pat. No. 4,712,939.

[30] Foreign Application Priority Data

Jan. 11, 1985 [JP] Japan .................................. 60-2610

[51] Int. Cl.$^5$ ........................ F16B 19/00; H05K 7/12
[52] U.S. Cl. .................................... 403/24; 403/405.1; 411/508; 174/138 D; 24/453; 248/73
[58] Field of Search ............ 403/24, 405.1–408.1, 403/252; 24/453, 573, 326, 297, 336, 458; 411/508–510; 174/138 D; 248/74.2, 74.3, 73

[56] References Cited

U.S. PATENT DOCUMENTS

| | | | |
|---|---|---|---|
| 3,874,766 | 4/1975 | Mizusawa | 174/138 D X |
| 3,996,500 | 12/1976 | Coules | 174/138 D X |
| 4,185,882 | 1/1980 | Johnson | . |
| 4,192,478 | 3/1980 | Coules | 174/138 D X |
| 4,371,137 | 2/1983 | Anscher | 248/73 |
| 4,430,776 | 2/1984 | Shimizu et al. | 174/138 D X |
| 4,493,580 | 1/1985 | Ruehl | . |
| 4,527,312 | 7/1985 | Ruehl et al. | 411/508 X |
| 4,566,660 | 1/1986 | Anscher et al. | 248/74.2 |
| 4,579,478 | 4/1986 | Takahashi | 403/406.1 X |
| 4,589,794 | 5/1986 | Sugiura et al. | 403/405.1 X |
| 4,627,760 | 12/1986 | Yagi et al. | . |
| 4,629,356 | 12/1986 | Hayashi | 411/508 X |
| 4,635,325 | 1/1987 | Yagi | 411/508 X |
| 4,644,614 | 2/1987 | Mizusawa | . |
| 4,681,288 | 7/1987 | Nakamura | 248/73 X |
| 4,712,939 | 12/1987 | Fujimoto | 403/405.1 X |

FOREIGN PATENT DOCUMENTS

| | | | |
|---|---|---|---|
| 2548292 | 1/1985 | France | . |
| 291338 | 6/1953 | Switzerland | . |
| 1584735 | 2/1981 | United Kingdom | . |
| 2142377 | 1/1985 | United Kingdom | 403/405.1 |
| 2143577 | 2/1985 | United Kingdom | 403/405.1 |

Primary Examiner—Peter M. Cuomo
Attorney, Agent, or Firm—Oblon, Spivak, McClelland, Maier & Neustadt

[57] ABSTRACT

A substrate support of integral construction, by which substrate (20, 39) can be fixed angularly to a plate (22, 40) and which comprising a base (3, 33), a fixing portion (1, 31) for coupling the base (3, 33), a first projection (7, 37) extending from the base (3, 33), and a second projection (8, 38) extending from a wall (9) extending from the base (3, 33). The substrate (20) is gripped by the base (3, 33), the first projection (7, 37) and the second projection (8, 38) so that the end of the substrate (20) can be inserted into the space between the first projection (7, 37) and the second projection (8, 38) and the substrate (20) can be fixed angularly to the plate (22, 40).

4 Claims, 9 Drawing Sheets

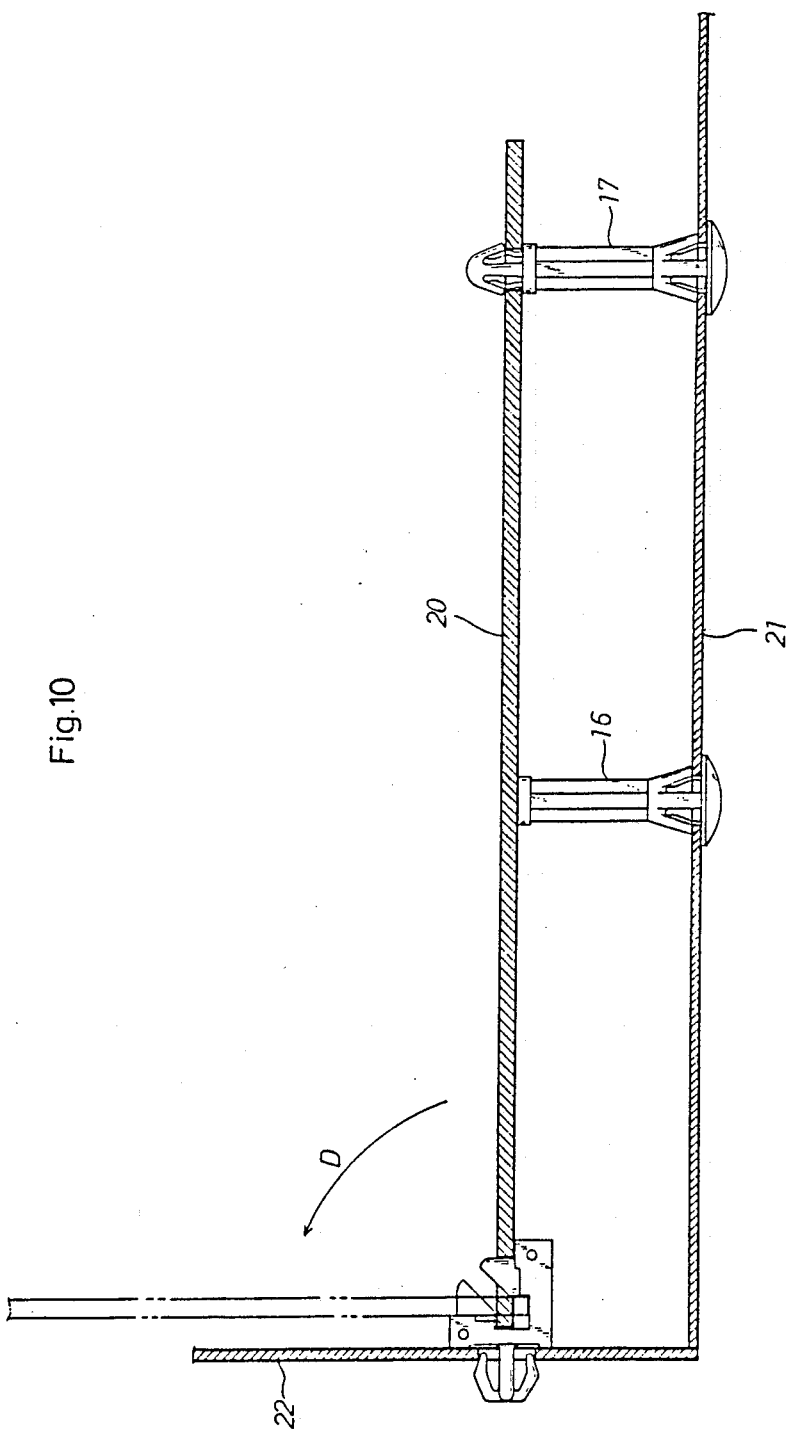

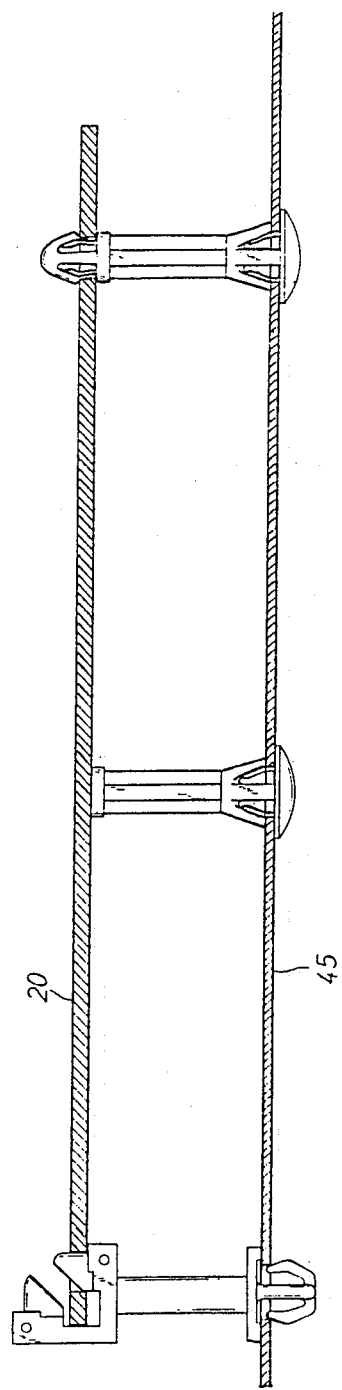

SUBSTRATE SUPPORT OF INTEGRAL CONSTRUCTION

This application is a continuation of application Ser. No. 102,500, filed on Sept. 29, 1987, now abandoned which is a continuation of Ser. No. 06/815,024 filed on Dec. 31,1985, now U.S. Pat. No. 4,712,939.

BACKGROUND OF THE INVENTION

1. Technical Field

The present invention relates to a substrate support for holding the end of a substrate fitted perpendicularly to or in parallel with a plate such as the chassis or printed circuit board of an electronic apparatus and mounting panel, so that the substrate can be optionally detached from the plate.

2. Prior Art

A substrate support for holding a substrate at the end to fit the substrate perpendicularly to a plate such as the chassis or printed circuit board of an electronic apparatus and a mounting panel has been known. The substrate support of such kind comprises a fixing portion fixed in the attaching hole of the plate, and a holding portion in which two holding elements are erected in parallel at a prescribed distance from each other on a base. The substrate is inserted between the two holding elements to pinch the end of the substrate to hold it.

However, since a substrate is only pinched between two holding elements in a conventional substrate support as mentioned above, there is a problem that the substrate can easily move in the direction of its surface and easily drop out of, due to vibration or the like. In addition, there is another problem that the substrate cannot be inserted between the two holding elements and therefore cannot be held at the end, when the substrate cannot be moved to be attached, in the direction of its surface, because of the presence of another article around the substrate.

SUMMARY OF THE INVENTION

The object of the present invention is to provide a substrate support by which a substrate can be held firmly enough not to move due to vibration or the like and to which the substrate can be easily attached by only inserting the substrate obliquely at a prescribed angle and moving the substrate vertically. The constitution of the present invention for attaining said object is embodied as a substrate support of integral construction, by which substrates (20, 39) can be fixed perpendicularly to plates (22, 40) and which includes the followings:

a base (3, 33);

a fixing portion (1, 31) for coupling the base (3, 33) to the plate (22, 40);

a first projection (7, 37) extending from the base (3, 33);

a second projection (8, 38) extending from a wall (9) extending from the base (3, 33);

and the substrate (20) is gripped by the base (3, 33), the first projection (7, 37) and the second projection (8, 38) so that the end of the substrate (20) can be inserted into the space between the first projection (7, 37) and the second projection (8, 38) and the substrate (20) can be fixed angularly to the plate (22, 40).

The fixing portion, which is fixed on the plate, serves to fasten the substrate support to the plate such as a chassis, a printed circuit board, a mounting panel or the like, and may be whatever can be fixed on the plate, such as a portion employing an elastic check piece fitted in the attaching hole of the plate, and a portion employing an adhesive tape, an adhesive agent or the like to stick the portion directly to the surface of the plate.

The first projection, which extends from the base, serves to engage and hold one side of the end of the substrate, and may be a projection or projections extending in parallel with the wall, or plural small projections juxtaposed in a row. What is required of the first projection is that by which one side of the end of the substrate is engaged and held after the substrate is attached and that the substrate does not drop out of the substrate support when and after the substrate is attached.

The wall has the second projection extending from the base just as the first projection and fitted in the fixation hole of the substrate. The second projection is placed in contact with the side of the substrate opposite to the first projection so that the first and the second projections hold the substrate perpendicularly to the base and the second projection keeps the substrate from moving in the direction of the surface of the substrate and dropping out of the holding portion of the support.

When the substrate support provided according to the present invention is to put in use, what needs to be done is to fix the support on the plate by fixation elements, then obliquely insert the substrate in between the first projection and the wall, and tilt the substrate down so as to fit the second projection in the fixation hole of the substrate. The substrate can thus be firmly fixed at the end by simple work.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying.

FIG. 10 shows an explanatory view indicating an example of the use of the second embodiment.

FIG. 12 shows an explanatory view indicating an example of the use of the third embodiment.

DETAILED DESCRIPTION OF PREFERRED EMBODIMENTS

Figure 1:
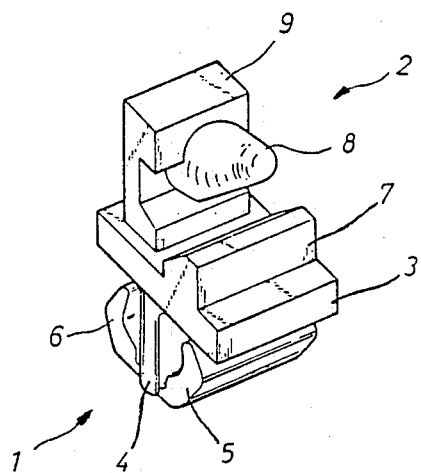
FIG. 1 shows an oblique view of the whole of a substrate support which is the first embodiment of the present invention.

Preferred embodiments of the present invention are hereinafter described referring to the drawings.

Figure 2:
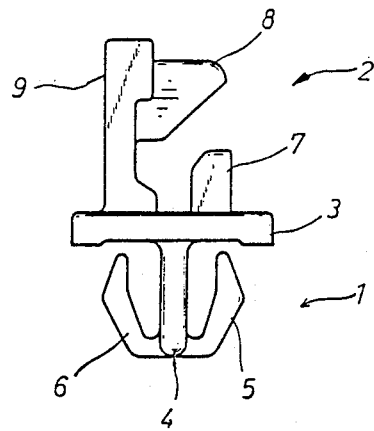
FIG. 2 shows a front view of the substrate support.
Figure 3:
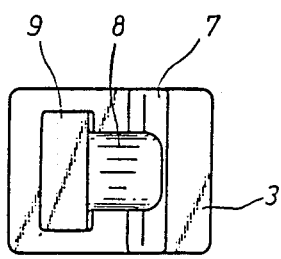
FIG. 3 shows a plan view of the substrate support.
Figure 4:
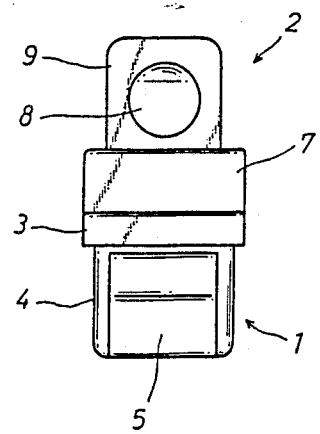
FIG. 4 shows a right-hand side view of the substrate support.
Figure 5A:
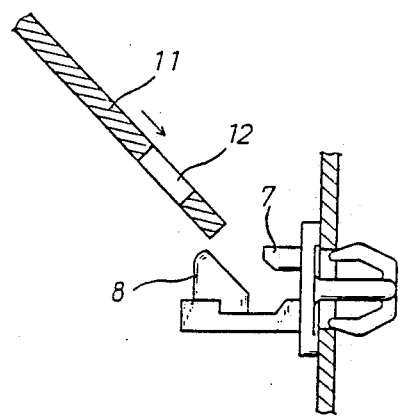
FIGS. 5A, 5B and 5C show views for explaining how to attach a substrate to the substrate support.
Figure 5B:
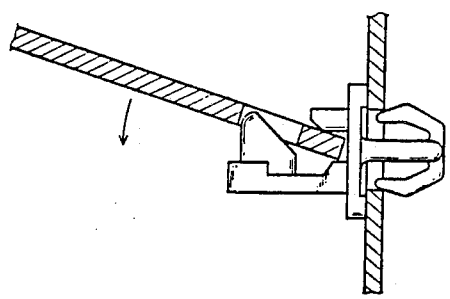
Figure 5C:
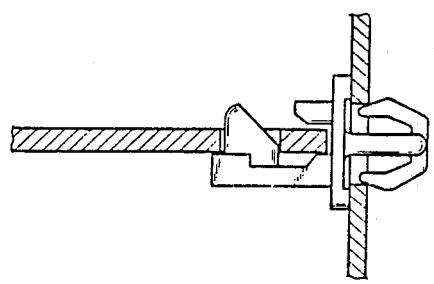

FIG. 1 shows an oblique view of the whole of a substrate support which is the first embodiment of the present invention. FIG. 2 shows a front view of the substrate support. FIG. 3 shows a plan view of the substrate support. FIG. 4 shows a right hand side view of the substrate support. Shown in these drawings are fixing portion 1 for fixing the support on a plate, and a holding portion 2 for holding a substrate. The fixing portion 1 includes a flat pillar 4 extending down from the center of the bottom of a base 3, and two elastic check elements 5 and 6 extending obliquely up from the end of the pillar. When the fixing portion 1 is fitted in the attaching hole of the plate, the support can be fixed on the plate by the elastic forces of the elastic check elements 5 and 6. The holding portion 2 includes a first projection 7 extending from the top of the base 3, and a wall 9 which extends in parallel with the first projection 7 and has a second projection 8, which is fitted in the fixation hole of the substrate. The second projection 8 is shaped as an obliquely-cut cylinder rounded on the cut end. The cut end face of the second projection 8 is located in front of the first projection 7 so that the substrate can be easily inserted between the first and the second projections. To attach the substrate 11 to the support, the substrate is obliquely inserted into the gap defined by the first projection 7 and the second projection 8, and the substrate is tilted down so that the second projection 8 is fitted in the fixation hole 12 while the front end of the substrate is engaged with the first projection 7, as shown in FIGS. 5(A) and 5(B). For that reason, the second projection 8 is previously provided with the cut end face for making it easily to insert the substrate 11 at first. In this embodiment, the part of the first projection which faces the second projection 8 is chamfered for the same purpose as the cut end face of the second projection. The angles of the cut end face and the chamfering can be set at desired values to determine the angle of the insertion of the substrate 11 at the time of the attachment of the substrate.

Figure 6:
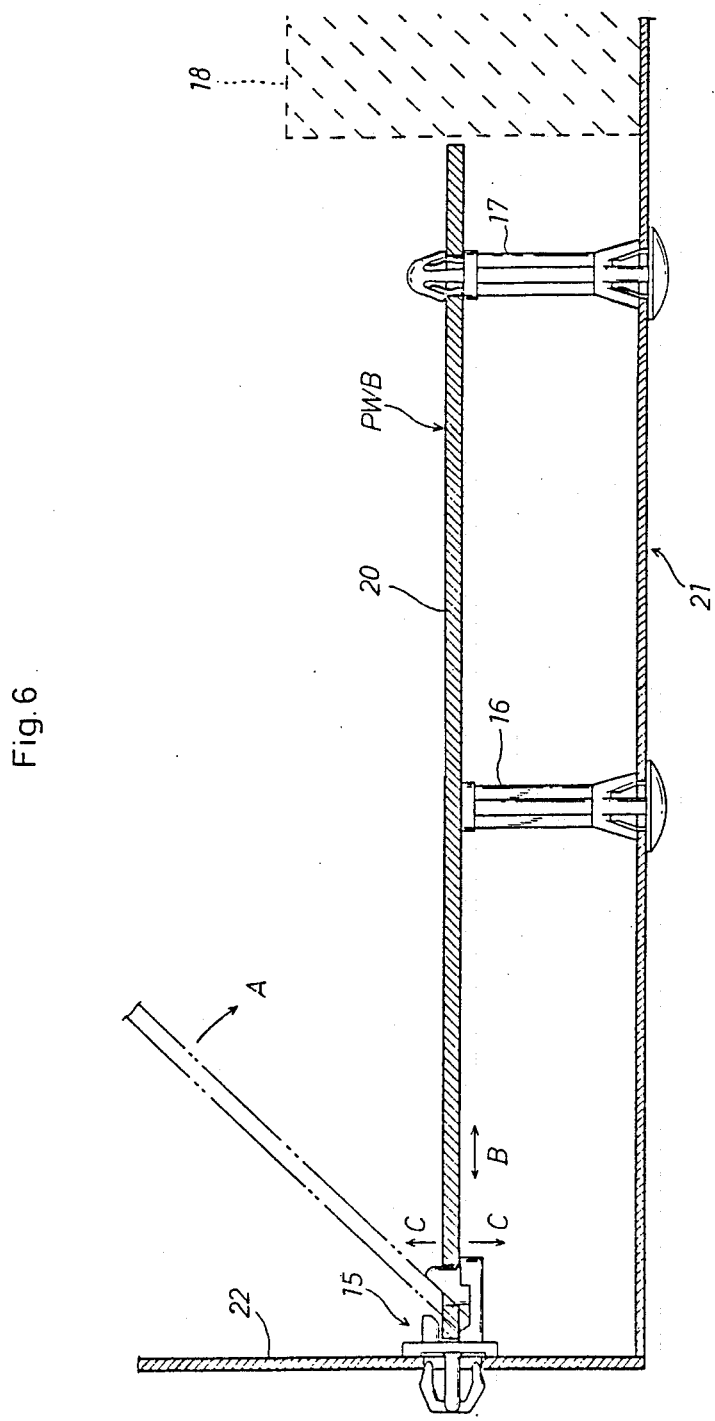
FIG. 6 shows an explanatory view indicating an example of the use of the substrate support.

The substrate support of the above-mentioned construction is integrally molded from a synthetic resin such as nylon, and put in use as shown in FIG. 6. Shown at 15 in FIG. 6 is the substrate support which is put in use together with fixation members 16, 17 which are different in form from the substrate support and hold the substrate at a distance from the plate. It will be understood from FIG. 6 that the substrate can be held perpendicularly to the plate to which the substrate support 15 is attached. According to such constitution, when a printed circuit board 20 is to be held over a chassis plate 21 in parallel therewith, the substrate support 15 is attached to another chassis plate 22, so that the printed circuit board 20 is firmly fixed at the end because the second projection 8 prevents the printed circuit board 20 from moving in a direction B and the first projection 7 and the wall 9 prevent the printed circuit board from moving in another direction C. To use the substrate support 15 in the above-mentioned manner, the printed circuit board 20 is obliquely inserted into the support 15 at first, as shown by a one-dot chain line in FIG. 6, and is thereafter only tilted down in the direction A. The printed circuit board can thus be easily attached even in a case that the printed circuit board cannot be inserted into a conventional support of insertion type and therefore cannot be held at the end because there is an article 18 near the attached position of the printed circuit board as shown by a dotted line in FIG. 6.

Figure 7:
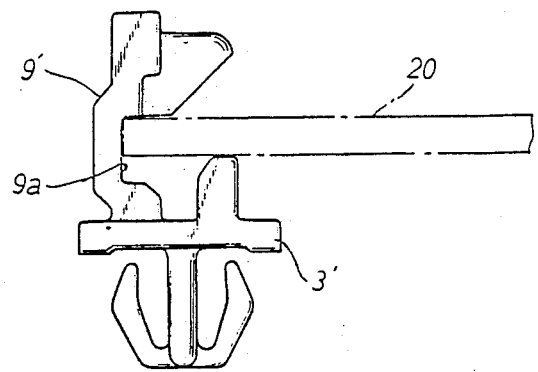
FIG. 7 shows a front view of a substrate support provided by forming a recess on the wall of the first embodiment.

While said embodiment is the substrate support by which the substrate can be held perpendicularly to the plate and be fixed, the wall 9' of the substrate support may be formed with a recess on the surface with which the plate is to be brought into contact, as shown in FIG. 7, so that the printed circuit board 20 can be temporarily held in parallel with the base 3' of the support, as shown by a one-dot chain line in FIG. 7, thus enhancing the work efficiency in the checking, maintenance and/or repairing of the printed circuit board 20.

Figure 8:
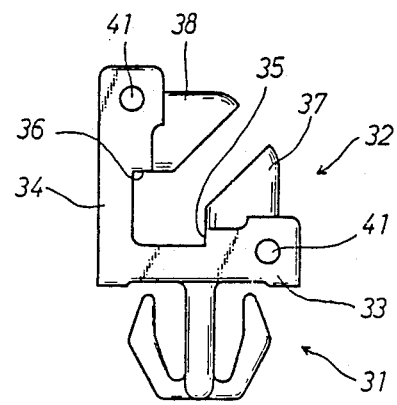
FIG. 8 shows a front view of a substrate support which is the second embodiment of the present invention.

The second embodiment of the present invention is hereinafter described. This embodiment is a substrate support by which a substrate can be held either perpendicularly to or in parallel with a plate to which the support is attached. FIG. 8 shows a front view of the substrate support. Shown at 31 and 32 in FIG. 8 are a fixing portion and a holding portion, respectively. Though the first projection and the wall extend from the base in the first embodiment, two bases are perpendicularly crossed with each other in the second embodiment. The bases 33 and 34 are provided with first projection 35 and 36 and second projection 37 and 38 so that one base 33 or 34 serves as a wall when the other 34 or 33 is used to face the end of a substrate.

Figure 9A:
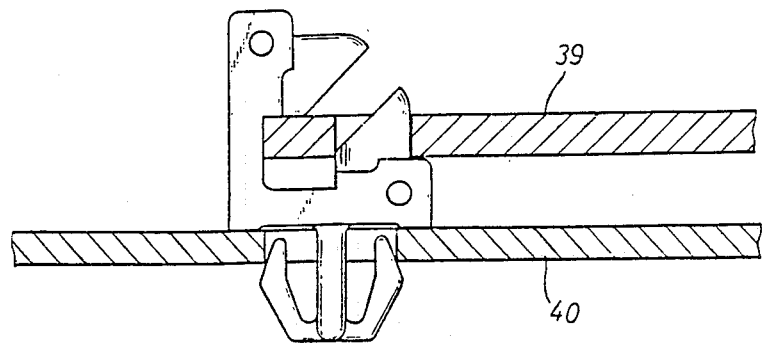
FIGS. 9A and 9B show views explaining how to use the second embodiment.
Figure 9B:
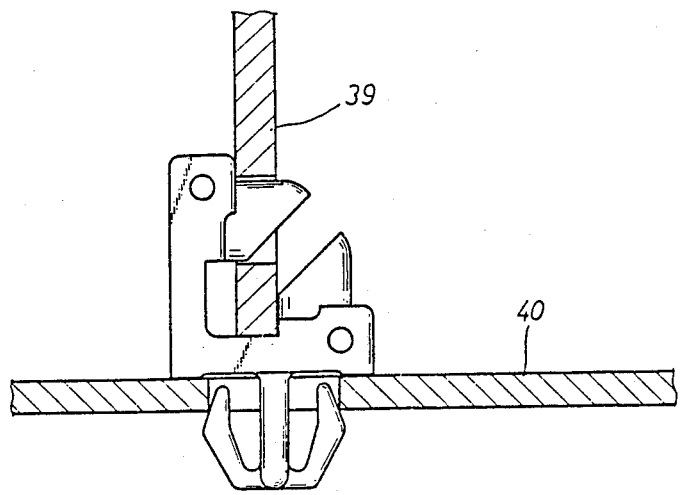

With the substrate support which is the second embodiment, the substrate 39 can be fixed either perpendicularly to or in parallel with the plate 40 to which the support is attached, as shown in FIGS. 9(A) and 9(B). For example, when a printed circuit board 20 is held in parallel with a chassis 21 by the substrate support and fixation members 16 and 17 different in form from the support, as shown in FIG. 10, the printed circuit board 20 can be turned in a direction D and then fixed to enhance the work efficiency in the checking, maintenance and/or repairing of the board 20.

Shown at 41 in FIG. 8 are circular holes provided to save the synthetic resin for molding the substrate support. In the second embodiment, the circular holes are located in the bases 33 and 34 near the second projection 37 and 38. The second projections 37 and 38 are formed in the same manner as the first embodiment, and the tips of the projections are cut to define a prescribed gap into which the substrate can be inserted.

Figure 11:
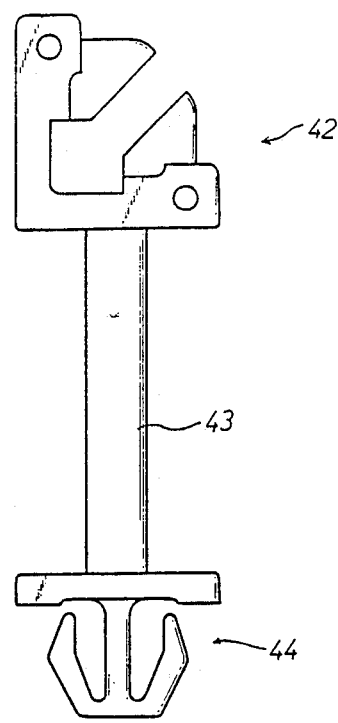
FIG. 11 shows a front view of a substrate support which is the third embodiment of the present invention.

FIG. 11 shows the third embodiment of the present invention, which is a substrate support in which a holding portion 42 having the same form as the second embodiment is provided with a pillar 43 on a fixing portion 44. If the length of the pillar 43 is appropriately set, a printed circuit board 20 can be held at a prescribed distance over a chassis 45 in parallel therewith, as shown in FIG. 12.

Although all the embodiments are the substrate supports which have elastic check elements in the fixing portions, respectively, the form of each of the fixing portions may be optionally determined as far as the support can be firmly fixed on the plate such as a chassis. For example, the fixing portion may be composed of a base, which is placed in contact with the plate, and an adhesive tape, which is provided on the base to stick the support to the plate as it is.

Figure 13:
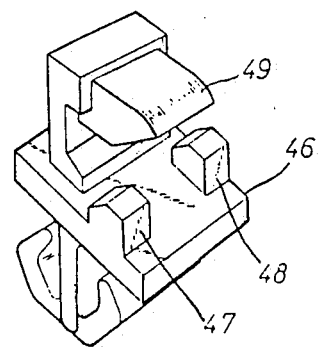
FIG. 13 shows an oblique view of a substrate support whose first and a second projections are different in form from those of the first, the second and the third embodiments.

Although the second projection of each of the embodiments has a cylindrical shape and the first projection of each of the embodiments is a continuous projection, the first projection may be made of two projections 47 and 48 extending from a base 46, and the second projection may be made of a prism-shaped projection 49, as shown in FIG. 13. If the prism-shaped projection 49 is provided in each of the embodiments, the fixation hole of the substrate needs to have an angular cross section.

As described in detail above, the substrate support provided according to the present invention has the holding portion which holds the substrate and includes the first projection extending from the base, and the wall having the second projection, so that the substrate can be firmly fixed by the second projection not to drop out of the support due to vibration or the like. When the substrate is to be attached to the support, the substrate does not need to be moved in the direction of the surface of the substrate in order to be inserted into the substrate support as in conventional substrate supports, but the substrate can be obliquely inserted at the side of the first projection and tilted down as it is, so that the substrate can be easily and surely attached. For that reason, even if there is an article around the attaching portion for the substrate, the substrate can be held as far as there is a space obliquely over the attaching portion.

Obviously, numerous modifications and variations of the present invention are possible in the light of the above teachings. It is therefore understood that, within the scope of the appended claims, the invention may be practiced otherwise than as specifically described herein.

What is claimed is:

1. A substrate support of integral construction by which a substrate containing a hole can be fixed angularly relative to a plate, said substrate support comprising:
   (a) a base having a first planar surface and a second planar surface parallel to said first planar surface;
   (b) a fixing portion extending from said first planar surface of said base for coupling said base to a plate;
   (c) at least one first projection extending perpendicularly from said second planar surface of said base, said at least one first projection having:
      (i) a first side surface perpendicular to said second planar surface of said base;
      (ii) a second side surface perpendicular to said second planar surface of said base and parallel to said first side surface of said at least one first projected; and
      (iii) a top surface perpendicular to said first side surface of said at least one first projection and parallel to said second planar surface of said base;
   (d) a wall extending perpendicularly from said second planar surface of said base, said wall having:
      (i) a first side surface perpendicular to said second planar surface of said base and parallel to said first side surface of said at least one first projection;
      (ii) a second side surface perpendicular to said second planar surface of said base and parallel to said first side surface of said wall;
      (iii) a top surface perpendicular to said first and second side surfaces of said wall and parallel to said second planar surface of said base;
      (iv) a third surface joining said first and second side surfaces;
      (v) a fourth side surface joining said first and second side surfaces; and
      (vi) a recess in said second side surface of said wall, said recess having a first side surface adjacent to said base and a second side surface remote from said base; and
   (e) a second projection extending from said second side surface of said wall toward said at least one first projection but leaving a space therebetween, said second projection having a sloping surface extending:
      (i) from a line parallel to said second planar surface of said base, perpendicular to said first and second side surfaces of said wall, and between said first and second side surfaces of said recess
      (ii) to a line parallel to said second planar surface of said base, perpendicular to said first and second side surfaces of said wall, and on the side of said second side surface of said recess remote from said base, wherein:
   (f) said at least one first projection further comprises a sloping surface joining said second side surface of said at least one first projection and said top surface of said at least one first projection and
   (g) said sloping surface of said at least one first projection is parallel to and spaced form said sloping surface of said second projection.

2. A substrate of integral construction by which a substrate containing a hole can be fixed angularly relative to a plate, said substrate support comprising:
   (a) a base having a first planar surface and a second planar surface parallel to said first planar surface;
   (b) a fixing portion extending from said first planar surface of said base for coupling said base to a plate;
   (c) at least one first projection extending perpendicularly from said second planar surface of said base, said at least one first projection having:
      (i) a first side surface perpendicular to said second planar surface of said base;
      (ii) a second side surface perpendicular to said second planar surface of said base and parallel to said first side surface of said at least one first projection; and
      (iii) a top surface perpendicular to said first side surface of said at least one first projection and parallel to said second planar surface of said base;
   (d) a wall extending perpendicularly from said second planar surface of said base, said wall having:
      (i) a first side surface perpendicular to said second planar surface of said base and parallel to said first side surface of said at least one first projection;
      (ii) a second side surface perpendicular to said second planar surface of said base and parallel to said first side surface of said wall;
      (iii) a top surface perpendicular to said first and second side surfaces of said wall and parallel to said second planar surface of said base;
      (iv) a third surface joining said first and second side surfaces;
      (v) a fourth side surface joining said first and second side surfaces; and
      (vi) a recess in said second side surface of said wall, said recess having a first side surface adjacent to said base and a second side surface remote from said base;

(e) a second projection extending from said second side surface of said wall toward said at least one first projection but leaving a space therebetween, said second projection having a sloping surface extending:
  (i) from a line parallel to said second planar surface of said base, perpendicular to said first and second side surfaces of said wall, and between said first and second side surfaces of said recess
  (ii) to a line parallel to said second planar surface of said base, perpendicular to said first and second side surfaces of said wall, and on the side of said second side surface of said recess remote from said base, wherein:
(f) said third side surface of said wall is perpendicular to said second planar surface of said base and perpendicular to said first and second side surfaces of said wall;
(g) said fourth side surface of said wall is perpendicular to said second planar surface of said base and parallel to said third side surface of said wall; and
(h) said first side surface of said recess slopes:
  (i) from a line a first distance from said base and a second distance from said at least one first projection and perpendicular to said third and fourth side surfaces of said wall
  (ii) to a line a third distance from said base that is greater than said first distance and a fourth distance from said at least one first projection that is greater than said second distance and perpendicular to said third and fourth side surfaces of said wall.

3. A substrate of integral construction as described in claim 2 wherein said second side surface of said recess is parallel to said second planar surface of said base.

4. A substrate support of integral construction by which a substrate containing a hole can be fixed angularly relative to a plate, said substrate support comprising:
(a) a base having a first planar surface and a second planar surface parallel to said first planar surface;
(b) a fixing portion extending from said first planar surface of said base for coupling said base to a plate;
(c) at least one first projection extending perpendicularly from said second planar surface of said base, said at least one first projection having:
  (i) a first side surface perpendicular to said second planar surface of said base;
  (ii) a second side surface perpendicular to said second planar surface of said base and parallel to said first side surface of said at least one first projection; and
  (iii) a top surface perpendicular to said first side surface of said at least one first projection and parallel to said second planar surface of said base;
(d) a wall extending perpendicularly from said second planar surface of said base, said wall having:
  (i) a first side surface perpendicular to said second planar surface of said base and parallel to said first side surface of said at least one first projection;
  (ii) a second side surface perpendicular to said second planar surface of said base and parallel to said first side surface of said wall;
  (iii) a top surface perpendicular to said first and second side surfaces of said wall and parallel to said second planar surface of said base;
  (iv) a third surface joining said first and second side surfaces;
  (v) a fourth side surface joining said first and second side surfaces; and
  (vi) a recess in said second side surface of said wall, said recess having a first side surface adjacent to said base and a second side surface remote from said base; and
(e) a second projection extending from said second side surface of said wall toward said at least one first projection but leaving a space therebetween, said second projection having a sloping surface extending:
  (i) from a line parallel to said second planar surface of said base, perpendicular to said first and second side surfaces of said wall, and between said first and second side surfaces of said recess
  (ii) to a line parallel to said second planar surface of said base, perpendicular to said first and second side surfaces of said wall, and on the side of said second side surface of said recess remote from said base, wherein said first side surface of said recess slopes:
(f) from a line a first distance from said base and a second distance from said at least one first projection and parallel to said first and second side surfaces of said wall
(g) to a line a third distance from said base that is greater than said first distance and a fourth distance from said at least one first projection that is greater than said second distance and parallel to said first and second side surfaces of said wall.

* * * * *